United States Patent [19]
Gaw et al.

[11] Patent Number: 4,864,370
[45] Date of Patent: Sep. 5, 1989

[54] ELECTRICAL CONTACT FOR AN LED

[75] Inventors: Craig A. Gaw, Scottsdale, Ariz.; Daniel L. Rode, St. Louis, Mo.

[73] Assignee: Motorola, Inc., Schaumburg, Ill.

[21] Appl. No.: 122,160

[22] Filed: Nov. 16, 1987

[51] Int. Cl.⁴ .......................................... H01L 33/00
[52] U.S. Cl. ...................................... 357/17; 357/68; 357/16
[58] Field of Search ...................... 357/17, 67, 68, 70, 357/71, 16, 4; 372/46

[56] References Cited

U.S. PATENT DOCUMENTS

| | | | |
|---|---|---|---|
| 3,875,473 | 4/1975 | LeBailly | 357/17 |
| 4,001,055 | 1/1977 | Charmakadze | 357/17 |
| 4,145,707 | 3/1979 | Sadamasa et al. | 357/68 |
| 4,603,280 | 7/1986 | Pankove | 357/4 |
| 4,707,716 | 11/1987 | Daniebe | 357/17 |
| 4,731,790 | 3/1988 | Sawai | 357/17 X |
| 4,750,183 | 6/1988 | Takahashi et al. | 357/17 X |
| 4,761,790 | 8/1988 | Hayakawa et al. | 357/17 X |
| 4,779,281 | 10/1988 | Naka et al. | 357/17 X |

FOREIGN PATENT DOCUMENTS

| | | | |
|---|---|---|---|
| 2012936 | 2/1971 | Fed. Rep. of Germany | 357/68 |
| 84498 | 7/1978 | Japan | 357/17 |

Primary Examiner—Andrew J. James
Assistant Examiner—Sara W. Crane
Attorney, Agent, or Firm—Joe E. Barbee

[57] ABSTRACT

A high efficiency light emitting diode is achieved through the use of a patterned metal contact. The metal contact is insulated from the structure of the light emitting diode to prevent current flow and subsequent light generation underneath the electrical bond pad. This shifts the drive current out to the patterned portion of the bond pad or metal contact.

8 Claims, 2 Drawing Sheets

ELECTRICAL CONTACT FOR AN LED

BACKGROUND OF THE INVENTION

This invention relates, in general, to light emitting diodes (LED), and more particularly, to an electrical contact for a high efficiency LED.

Typically, light emitting diodes have a top and a bottom electrical contact. For a red LED, i.e., one which emits red light, the epitaxial material on the top surface of the structure usually consists of N-type conductivity AlGaAs which has a limited maximum carrier concentration and very low mobility. Therefore the spreading resistance inherent in the device becomes a problem. To enhance the light emission from the light emitting region outside of the electrical contact area a patterned contact is used to spread drive current across the LED surface. However, drive current is wasted underneath the electrical contact area from which light cannot be emitted. Therefore, it would be desirable to provide an LED structure which makes maximum use of the drive current.

Accordingly, it is an object of the present invention to provide an improved electrical contact for a light emitting diode.

An additional object of the present invention is to provide a high efficiency red LED.

SUMMARY OF THE INVENTION

The above and other objects and advantages of the present invention are achieved by providing a high efficiency light emitting diode having a patterned electrical contact. The electrical contact is electrically insulated from the top layer of the LED. This will shift or force the drive current out to the patterned portion of the electrical contact. Typically in a red LED the top layer of the structure is N-type conductivity AlGaAs.

DETAILED DESCRIPTION OF THE DRAWINGS

Figure 1:
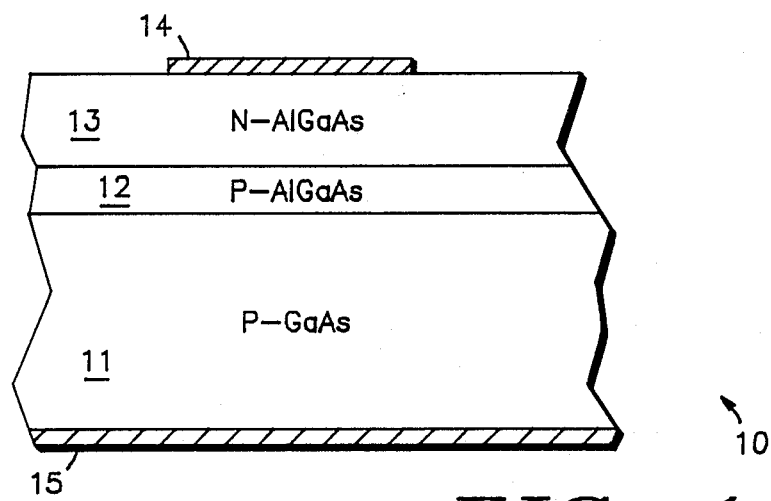
FIG. 1 illustrates, in skeleton form, a cross-sectional view of a GaAs LED.

FIG. 1 illustrates an AlGaAs light emitting diode 10 capable of emitting a red colored light. Diode 10 is commonly referred to as a red LED. Substrate 11 is P conductivity GaAs having a dopant concentration which may be greater than $8 \times 10^{18}$ atoms per cubic centimeter. Substrate 11 can have a thickness of 150-200 microns. An electrical contact 15 covers the bottom side of substrate 11. In a preferred embodiment, metal layer 15 is a composition of zinc and gold with thicknesses of 30 and 70 nanometers, respectively. The top of substrate 10 is covered by a P conductivity epitaxial layer 12. Typically P-type layer 12 is a layer of AlGaAs having a thickness of 10-50 microns. In a preferred embodiment, 34% aluminum is used along with 66% gallium and the dopant concentration is $4 \times 10^{17}$ atoms per cubic centimeter. Layer 12 is covered by an epitaxial layer 13. Layer 13 is N-type conductivity AlGaAs with a thickness between 30 and 80 microns. In a preferred embodiment, layer 13 has 65% aluminum to 35% gallium and a dopant concentration of $7 \times 10^{17}$ atoms per cubic centimeter. An electrical contact 14 makes contact to epitaxial layer 13. Metal contact 14 is often referred to as an electrically conductive bond pad since a current carrying wire can be bonded to contact 14. In order for LED 10 to produce light an electrical voltage is applied to LED 10 between metal contact 14 and metal contact 15. This causes light to be generated between the PN junction created between layers 12 and 13. Since metal contact 14 is opaque none of the light beneath contact 14 will be visible. The only visible light will be that reflected off to the sides and appearing around contact 14. LED 10 has a very low mobility and therefore its spreading resistance is very high. This means that most of the light is generated beneath bond pad 14 and trapped there. The high spreading resistance means that current flowing from metal contact 14 to contact 15 generally flows directly beneath contact 14 as opposed to spreading out over a wider range. The mobility of layer 13 is typically 85 cm²/V-sec.

Figure 2:
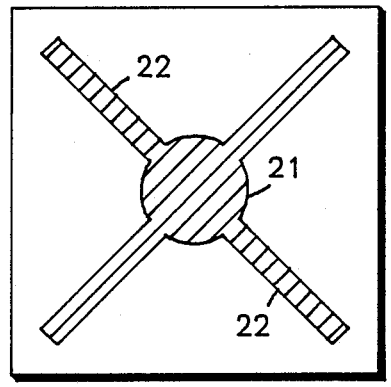
FIG. 2 is a top view of a prior art patterned electrical contact.

FIG. 2 illustrates a prior art electrical contact configuration which is useful in overcoming the low mobility and high spreading resistance of the device of FIG. 1. A red LED 20 is illustrated having metal contact 21 with a plurality of conductive lines 22 extending from metal contact 21. This patterned bond pad or metal contact permits more light to be reflected around the metal contact. However, metal contact 21 covers a relatively large surface area of LED 20 and drive current is still wasted beneath metal contact 21.

Figure 3:
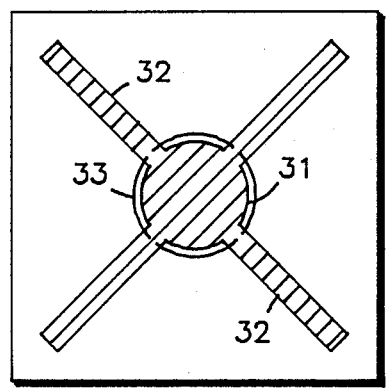
FIGS. 3-6 are top views of various embodiments of an electrical contact in accordance with the present invention.

FIG. 3 illustrates LED 10 having a patterned metal contact 31 and a configuration which increases the efficiency of the device illustrated in FIG. 2. Metal contact or bond pad 31 has a plurality of conductive lines 32 extending therefrom. In addition, a dielectric or insulating material 33 is positioned beneath metal contact 31. Dielectric 33 prevents current flow and subsequent light generation underneath bond pad 31. This tends to shift the drive current out to thin conductive lines 32. In addition, the dielectrics optical thickness may be made equal to one half the wavelength of the light emitted from the LED to reflect light off of the metal contact and back into the device. Thereby the efficiency of the LED is further enhanced.

Figure 4:
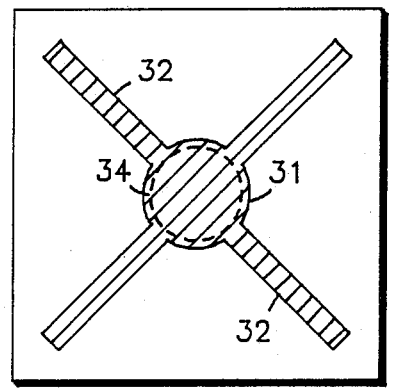

FIG. 4 illustrates a modification to the embodiment shown in FIG. 3. The only difference between the embodiments of FIGS. 3 and 4 is that in FIG. 4 dielectric 34 is smaller in diameter than bond pad 31. This will allow some light to be generated around the periphery of bond pad 31. In a preferred embodiment, dielectric 33 does not extend past the periphery of bond pad 31 more than one half the thickness of layer 13 (FIG. 1).

Figure 5:
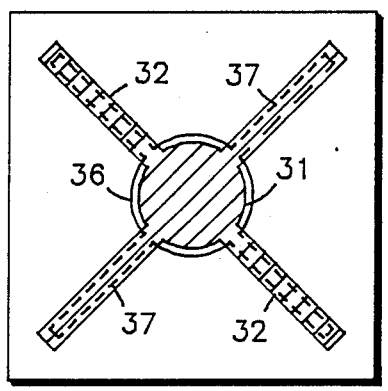
Figure 6:
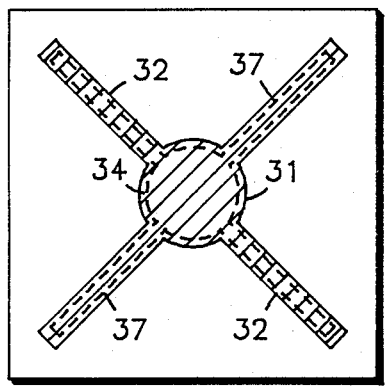

FIG. 5 illustrates yet another modification to the embodiment illustrated in FIG. 3. The difference between the embodiment of FIG. 3 and the embodiment of FIG. 5 is that the fingers or conductive lines 32 of FIG. 5 have a narrow strip of dielectric 37 positioned beneath each conductive line 32. FIG. 6 is a modified embodiment of that illustrated in FIG. 5. The difference between the embodiments of FIG. 5 and FIG. 6 is that dielectric 34 in FIG. 6 does not extend beyond bond pad 31.

The embodiments illustrated in FIGS. 3-6 all have bond pad 31 with a plurality of conducting lines extending from bond pad 31 positioned on top of LED 10. The difference between these embodiments is the use of a dielectric or insulating material, which can be any suitable dielectric such as silicon dioxide, silicon nitride, or the like. In addition, electrically conductive bond pad 31 has been illustrated in a circular configuration. It will be understood that bond pad 31 can be any configuration such as a square and the extending conductive lines illustrated can have additional conductive lines extending from them. In addition bond pad 31 can have more than the extending conductive lines illustrated.

We claim:

1. A light emitting diode having a high efficiency contact, comprising: a substrate of a first conductivity; a first epitaxial layer of the first conductivity over the substrate; a second epitaxial layer of a second conductivity over the first epitaxial layer; a bond pad positioned on a predetermined area of the second epitaxial layer, the bond pad having a plurality of metal lines extending therefrom for making contact to the light emitting diode; and a dielectric layer positioned underneath the bond pad to prevent current flow directly beneath the bond pad between the bond pad and the second epitaxial layer, thereby reducing light generation directly beneath the bond pad.

2. The light emitting diode of claim 1 wherein the substrate is GaAs, the first epitaxial layer is P-type Al-GaAs, and the second epitaxial layer is N-type AlGaAs, and the light emitting diode is a red LED.

3. The light emitting diode of claim 1 wherein the dielectric layer is an oxide such as silicon dioxide.

4. A light emitting diode having an electrically conductive bond pad which has a plurality of conductive lines extending from the bond pad for passing current to the light emitting diode, and an electrically insulating layer placed beneath the bond pad to reduce light generation underneath the bond pad and to shift drive current out to the conductive lines.

5. The light emitting diode of claim 4 wherein the electrically insulating layer extends from beneath the bond pad.

6. The light emitting diode of claim 4 being an AlGaAs red LED.

7. The light emitting diode of claim 4 wherein an electrically insulating layer is also placed beneath a central portion of each of the plurality of conductive lines.

8. The light emitting diode of claim 4 wherein the optical thickness of the electrically insulating layer is one half the wavelength of the light emitted from the light emitting diode.

* * * * *